United States Patent [19]

Krulik

[11] Patent Number: 5,252,225
[45] Date of Patent: Oct. 12, 1993

[54] METHOD FOR PRECIPITATING AN ORGANIC RESIN FROM AN ALKALINE SOLUTION THEREOF

[75] Inventor: Gerald A. Krulik, El Toro, Calif.

[73] Assignee: Morton International, Inc., Chicago, Ill.

[21] Appl. No.: 797,612

[22] Filed: Nov. 25, 1991

[51] Int. Cl.$^5$ ............................................. C02F 1/52
[52] U.S. Cl. ........................... 210/724; 210/908; 210/726
[58] Field of Search ............... 210/724, 726, 723, 908

[56] References Cited

U.S. PATENT DOCUMENTS

| | | | |
|---|---|---|---|
| 4,760,014 | 7/1988 | Wong | 210/723 |
| 4,857,206 | 8/1989 | Choo | 210/709 |
| 4,999,114 | 3/1991 | Choo | 210/709 |
| 5,182,029 | 1/1993 | Erb | 210/724 |

*Primary Examiner*—Stanley S. Silverman
*Assistant Examiner*—Neil M. McCarthy
*Attorney, Agent, or Firm*—Robert M. Didrick; Gerald K. White

[57] ABSTRACT

The use of aluminum sulfate to neutralize alkaline solutions yields a gelatinous precipitate. When neutralization of the solution causes other materials to precipitate along with the gel, filtration of the precipitated materials is very difficult because of the gel. The addition of water soluble magnesium, aluminum, and/or calcium salts as primary neutralizing agents for an alkaline stripper solution of a photoresin, followed by the acidification of the resulting slurry to a pH of from about 2 to about 3 gives a slurry of the precipitated resin which may be filtered quickly.

16 Claims, No Drawings

METHOD FOR PRECIPITATING AN ORGANIC RESIN FROM AN ALKALINE SOLUTION THEREOF

BACKGROUND OF THE INVENTION

This invention relates to the treatment and disposal of acidic photoresist resins after development and stripping during manufacture of printed circuit boards and the like. More particularly, it relates to the neutralization of aqueous alkaline solutions of resins which result from such operations. Still more particularly, it relates to the fast filtration of the sludge created by the neutralization and acidification of such solutions.

In the preparation of printed circuit boards, a copper-clad substrate is coated with an alkali-soluble photo-sensitive polymer called a photoresist and the photoresist is exposed image-wise to actinic radiation to further polymerize the exposed areas and make them less soluble. The negative image is that developed on the substrate by dissolving away the non-exposed areas while leaving the less soluble resin in place. The copper that is thus uncovered is removed by an etchant and then the remaining photoresist is stripped from the substrate by another alkaline solution that is suitably hot. The development and stripping of positive photoresists are done in aqueous alkaline solutions in like manner.

The advantages of forming resinous photopolymerizable compositions which can be developed in aqueous systems without the need of organic solvents have been recognized as far back as 1956. After several years of attempts by many investigators in the field of photoresist chemistry, Gilano et al. disclosed alkali-soluble photoresists having a binder comprising a co-polymer of styrene or other vinyl monomer and an unsaturated carboxyl-containing monomer in U.S. Pat. No. 3,953,309. The teachings of Gilano et al. in the '309 patent are incorporated herein by reference. One of the problems arising from this advance in the art, however, is the disposal of huge volumes of alkaline waste materials which must be neutralized before they may be introduced into sewage treatment plants or into a landfill. Neutralization with an acid would seem to be the most natural and most straightforward way but the resin becomes a sticky precipitate which constantly clogs the systems designed to separate it from the aqueous phase. The use of aluminum sulfate to overcome that problem and produce a particulate, non-sticky precipitate containing the photoresist resin and aluminum hydroxide which may be filtered from the neutral slurry is taught in U.S. Pat. No. 4,857,206, which also is incorporated herein by reference. Although the filtration rate is much better than what had been suffered through before, the volume of the filter cake is so great that the filter press must be opened for removal of the cake with uneconomical frequency. The greater part of this volume is that attributable to the bulky aluminum hydroxide matrix surrounding the particles of solid resin.

The removal of photopolymer resins from spent developer and stripper mixtures without the formation of an unctuous, gumlike sludge may be accomplished by the addition of an acid, a polyvalent salt, and a coagulation aid to the mixtures, according to U.S. Pat. No. 4,760,014. The ratio of acid to polyvalent cation is from 5:1 to 35:1 by weight.

Aluminum sulfate is also taught as a coagulant for sludges in the treatment of municipal waste water in U.S. Pat. No. 4,028,238. The dewatering of such sludges by filtration is taught therein to be extremely difficult and the solids content of the sludge after filtration is said to be less than 15% by weight. The solution to the problem, according to the '238 patent, is to add calcium hydroxide to the sludge after the alum treatment and decanting of the supernatant water. The rate of filtration is increased seven-fold and the solids content is markedly increased.

In U.S. Pat. No. 1,173,698, titanium sulfate is used to facilitate the precipitation of aluminum hydroxide which occurs when aluminum sulfate is added as a coagulant to certain water supplies. Titanium hydroxide is also formed and the patentee teaches that it induces a more rapid and more finely divided precipitation of the aluminum hydroxide.

SUMMARY OF THE INVENTION

It is an object of this invention to provide a method for the precipitation of an acidic organic resin from an aqueous alkaline solution thereof whereby an even faster filtration of the precipitate from the aqueous solution is achieved.

It is a related object of this invention to provide a method for the acidification, rather than neutralization, of a spent alkaline stripper/developer solution of a photoresist and the formation of a particulate, non-sticky precipitate of such resin which may be separated from the slurry very quickly and thoroughly by filtration.

DESCRIPTION OF THE PREFERRED EMBODIMENTS

These and other objects of the invention which will become apparent from the following description are achieved by introducing a water soluble salt of aluminum, calcium, and/or magnesium into the alkaline solution of the acidic resin and then acidifying the mixture to a pH of from about 2 to about 4 before filtering the resulting sludge.

The soluble salts of aluminum, magnesium, and calcium are well known to those of ordinary skill in chemistry and are exemplified by the nitrates, chlorides, acetates, formates, and gluconates of each and by the sulfates of aluminum and magnesium. The basic polychloro-aluminum sulfate sold by Atochem UK Ltd. is also suitable. The anions of each salt may be the same or different in any given instance.

The method of this invention consists essentially of adding one or more of the named salts as primary neutralizing agents, said salts being referred to hereinafter as primary neutralizing salts, and then adding an acid to lower the pH to a value of from about 2 to about 4 and, preferably, from about 2 to about 3. The acid, of course, must be a relatively strong acid which is not subject to buffering by the aluminum ion which would prevent the attainment of the preferred pH. Here, a more readily filterable precipitate is obtained without an organic coagulation aid such as is taught in the '014 patent but the presence of salts of other metals which have insoluble hydroxides, such as ferrous sulfate, as additives or impurities in the aluminum, magnesium or calcium salts is also suitable to the method. The hydrates of each of these salts, such as $MgSO_4.7H_2O$ and $AlCl_3.6H_2O$, may be used.

As indicated above, the aluminum, calcium and magnesium salts may be used alone or in mixtures of any two or even all three. Because of the acidification, only small amounts of the primary neutralizing salts are needed to aid in the formation of an easily filterable precipitate of the neutralized resin. A typical aqueous alkaline solution which is used to dissolve a photoresist will contain about 3% potassium hydroxide or about 0.5 equivalent per 1000 grams which means that 1000 grams of the alkaline solution of the photoresist will contain about 0.5 equivalent of the base, e.g., alkali metal or amine salt of the photoresist and free base. For an alkaline solution of the photoresist which contains from about 0.5 to about 4 equivalents of base thus calculated, the amount of primary neutralizing salt may be from 1 gram per liter to about 200 grams per liter of the alkaline solution of photoresist. The preferred amount is from about 2 to about 150 g/l and even more preferred is an amount of from about 4 to about 75 g/l. The salts may be mixed in any proportion. A preferred ratio of calcium salt to magnesium salt is about 4:1 by weight.

In Examples I and II, which illustrate the invention in more detail, an Alkastrip ® SQI solution containing 30 mil-sq ft of Dynachem's LAMINAR ® HG dry film (exposed) per gallon is neutralized by the addition of a salt or salts, as indicated, and then it is acidified with 50% by weight sulfuric acid to the pH value indicated. Filtration of the resulting slurry was carried out with aid of vacuum in a Nalgene Type A filter kit having 0.5 micron apertures.

EXAMPLE 1

To 500 mls of the photoresist solution there was added 4 grams of $CaCl_2$ and then 50% sulfuric acid solution was added to reduce the pH to 6.0. A 160 ml sample of the thus treated solution was removed and a 50 ml aliquot was filtered for 10 minutes but only 10 mls of filtrate were obtained. The remaining 340 mls of the slurry were further acidified to a pH of 4.0 with the sulfuric acid and another 160 ml sample was taken for further treatment. A 50 ml aliquot of the pH 4 slurry was filtered for 10 minutes and 40 mls of filtrate were obtained. Further acidification of the remaining 180 mls of the pH 4 slurry sample with the sulfuric acid gave a slurry with a pH of 2. A 50 ml aliquot of this slurry gave 42 mls of filtrate in 10 minutes.

EXAMPLE II

To 250 mls of the photoresist solution (initial pH; 10.14) there was added a mixture of 4 grams of $CaCl_2$ and 1 gram of $MgCl_2$ and then a 50% solution of sulfuric acid was added to reduce the pH to 6.5. A 100 ml aliquot was filtered for 10 minutes to give 30 mls of filtrate. Filtration of a 50 ml aliquot of the slurry after reducing the pH further to 3.3 with the sulfuric acid solution was complete in 2 minutes.

EXAMPLE III

To 500 mls of a 10% Alkastrip SQI solution containing 10 mil-sq ft of exposed Laminar HG dry film and having an initial pH of 10.06 there was added 300 mls of Dynachem's RS-1231 precipitant to reduce the pH to 6.04. Filtration of the slurry as in Examples I and II for 8 minutes gave 20 mls of filtrate. After the addition of sulfuric acid to reduce the pH to 2, filtration of the slurry yielded 90 mls of filtrate in 13 minutes.

Resin which had not been exposed to light during the imaging process and thus was removed by a developer solution is precipitated from that solution or from a mixture of developer and stripper in like manner.

The subject matter claimed is:

1. A method for separating a photoresist from an aqueous alkaline solution of the photoresist, said method consisting essentially of precipitating the photoresist by introducing a water-soluble salt of at least one metal selected from the group consisting of aluminum, calcium and magnesium into the alkaline solution, adjusting the pH of the mixture to a value of from about 2 to about 3, and separating the precipitate from the acidified solution.

2. The method of claim 1 wherein the alkaline solution contains from about 0.5 to about 4 equivalents of a base per 1000 grams and the amount of the salt is from about 1 gram per liter to about 200 grams per liter of the alkaline solution.

3. The method of claim 2 wherein the alkaline solution contains about 0.5 equivalent (30 grams of KOH) of a base per 1000 grams.

4. The method of claim 1 wherein a mixture of a calcium salt and a magnesium salt is added to the alkaline solution.

5. The method of claim 4 wherein the calcium and magnesium salts are present in a ratio of about 4:1 by weight.

6. The method of claim 2 wherein about 16 grams of calcium chloride per liter of the alkaline solution is added to reduce the pH to about 6 and then an acid is added.

7. The method of claim 1 wherein the salt is an aluminum salt.

8. The method of claim 1 wherein the salt is a calcium salt.

9. A method for increasing the rate of filtration of a slurry consisting essentially of forming a slurry by precipitating a photoresist resin from an aqueous alkaline solution of the resin by introducing a water soluble-salt of aluminum, calcium, and/or magnesium into the alkaline solution in the absence of a coagulating agent, and adjusting the pH of the slurry to a value of from about 2 to about 3, and then filtering said pH-adjusted slurry.

10. The method of claim 9 wherein the alkaline solution contains from about 0.5 to about 4 equivalents of a base per 1000 grams and the amount of the salt is from about 1 gram per liter to about 200 grams per liter of the alkaline solution.

11. The method of claim 9 wherein a mixture of a calcium salt and a magnesium salt is introduced into the alkaline solution.

12. The method of claim 11 wherein the calcium and magnesium salts are present in a ratio of about 4:1.

13. The method of claim 9 wherein the salt is an aluminum salt.

14. The method of claim 9 wherein the salt is a calcium salt.

15. The method of claim 9 wherein the amount of salt is from about 4 to about 75 grams per liter of the alkaline solution.

16. The method of claim 9 wherein the pH of the slurry is reduced from a value of from 6 to 6.5.

* * * * *